(12) United States Patent
Santin et al.

(10) Patent No.: US 7,706,191 B2
(45) Date of Patent: Apr. 27, 2010

(54) SYSTEMS AND METHODS TO REDUCE INTERFERENCE BETWEEN MEMORY CELLS

(75) Inventors: Giovanni Santin, Rieti (IT); Violante Moschiano, Bacoli (IT)

(73) Assignee: Intel Corporation, Santa Clara, CA (US)

( * ) Notice: Subject to any disclaimer, the term of this patent is extended or adjusted under 35 U.S.C. 154(b) by 73 days.

(21) Appl. No.: 12/005,994

(22) Filed: Dec. 28, 2007

(65) Prior Publication Data

US 2008/0205155 A1 Aug. 28, 2008

(30) Foreign Application Priority Data

Dec. 29, 2006 (IT) .................... TO2006A000931

(51) Int. Cl.
*G11C 16/04* (2006.01)
(52) U.S. Cl. .............. 365/185.29; 365/185.02; 365/185.03; 365/185.28; 365/185.33
(58) Field of Classification Search ............ 365/185.33, 365/185.29
See application file for complete search history.

(56) References Cited

U.S. PATENT DOCUMENTS

| | | | | |
|---|---|---|---|---|
| 7,508,711 | B2 * | 3/2009 | Goda | 365/185.17 |
| 2005/0169057 | A1 * | 8/2005 | Shibata et al. | 365/185.28 |
| 2006/0120162 | A1 * | 6/2006 | Fujiu et al. | 365/185.24 |
| 2008/0158952 | A1 * | 7/2008 | Aritome | 365/185.03 |

* cited by examiner

*Primary Examiner*—Son L Mai
(74) *Attorney, Agent, or Firm*—Schwegman, Lundberg & Woessner, P.A.

(57) ABSTRACT

Embodiments of the inventive subject matter provide systems and methods for programming a set of memory cells by inducing a first voltage on the lower page of a first group of memory cells to hold a first least significant bit, and by inducing a second voltage on the lower page of a second group of memory cells to hold a second least significant bit. Once the lower page is programmed, the voltage may be shifted to the upper page of each memory cell into a final range representing one or more most significant bits to be programmed. Each memory cell may store a voltage within a final programmed range representing a binary value.

21 Claims, 4 Drawing Sheets

SYSTEMS AND METHODS TO REDUCE INTERFERENCE BETWEEN MEMORY CELLS

CLAIMS OF PRIORITY

This application claims priority under 35 U.S.C. 119 from Italian Application No. TO2006/A000931 filed Dec. 29, 2006, which application is incorporated herein by reference.

FIELD

Embodiments of the inventive subject matter relate to memory cells and more particularly, to reducing interference between memory cells.

BACKGROUND

Non-volatile memory devices such as flash memory devices are used to store data or information. Many computers and electronic devices, for example, digital audio players, digital cameras, digital recorders, and cellular phones, have flash memory devices. Flash memory devices may also be used as portable storage devices such as portable Universal Serial Bus (USB) flash drives or "thumb" drives. Flash memory devices may not need power to maintain the information stored in the device.

A flash memory device stores information in numerous memory cells, which are usually formed in a semiconductor chip. Each of the memory cells often has a metal-oxide semiconductor (MOS) transistor with two different transistor gates: a control gate and a so-called "floating" gate. The control gate may be used to turn the transistor on and off to control access to the memory cell. The floating gate may be the place where one or more bits of information may be stored in each memory cell.

In a memory array, nearby cells may interfere with each other, specifically during programming phases. Programming a cell entails bringing that particular cell up to a specified voltage, Vt. Unfortunately, this process causes interference based on the changing voltage and capacitive coupling between nearby cells. This interference between floating gate transistors is referred to as Fg-Fg interference.

As technology advances and the size of devices get smaller and smaller, the scaling of memory cells decreases. This scaling moves the memory cells closer, and subjects them to increased interference as capacitive coupling becomes stronger.

Fg-Fg interference is a problem present in Single-Layer Cell (SLC) memory but is a bigger problem in Multi-Layer Cell (MLC) memory. Because there are more distributions in MLC memory, the changing voltage Vt can be even higher.

DESCRIPTION OF EMBODIMENTS

The following description includes embodiments for more efficiently programming memory cells and reducing interference between the floating gate transistors.

Figure 1:
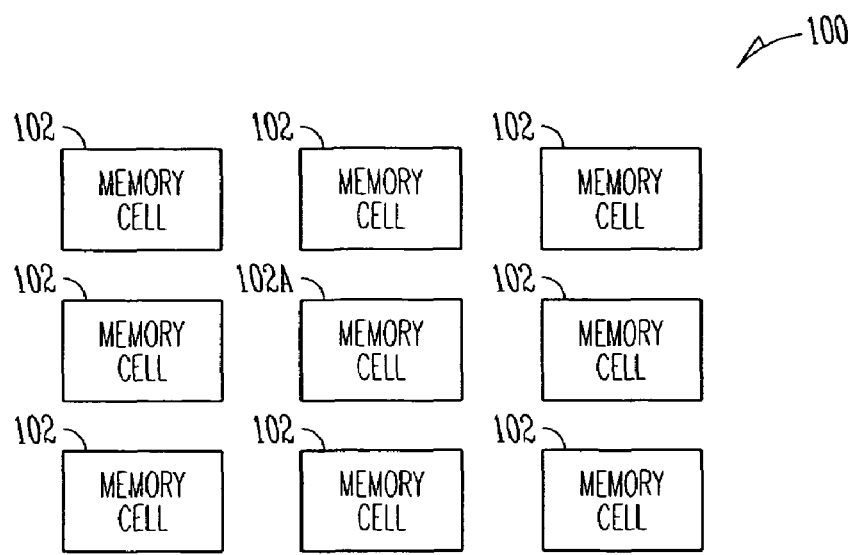
FIG. 1 illustrates a block diagram of a memory array according to various embodiments.

FIG. 1 illustrates a block diagram of a memory array 100 according to various embodiments. The memory array 100 includes memory cells 102 which may be electrically erasable and programmable read only memory devices (EEPROM). The EEPROMs in the memory array 100 may also be called flash memory cells or floating gate transistor memory cells. A single layer memory cell may hold one of two threshold voltages Vt. A multi layer cell may hold one of four or more threshold voltages Vt. The number of threshold voltages Vt that a memory cell 102 may hold determines how many bits the memory cell 102 can potentially represent. For example, a single layer cell capable of holding one of two threshold voltages Vt is a one bit memory cell—it can represent a 1 or a 0. A multi-layer cell is capable of holding more threshold voltages and thus more bits may be represented. For example, a memory cell capable of holding one of four threshold voltages Vt is a two bit memory cell—it can represent 00, 01, 10, or 11. In two-bit multi-layer memory, a cell may have a lower page and an upper page each capable of being programmed to hold a voltage representing one bit. According to various embodiments, the lower page may hold one of two threshold voltages Vt which corresponds to the least significant bit, or the rightmost bit. The upper page of the memory cell may then hold a final programmed voltage to determine the most significant bit, or the leftmost bit. This programming is referred to as two-phase programming and will be discussed in more detail below.

Figure 2:
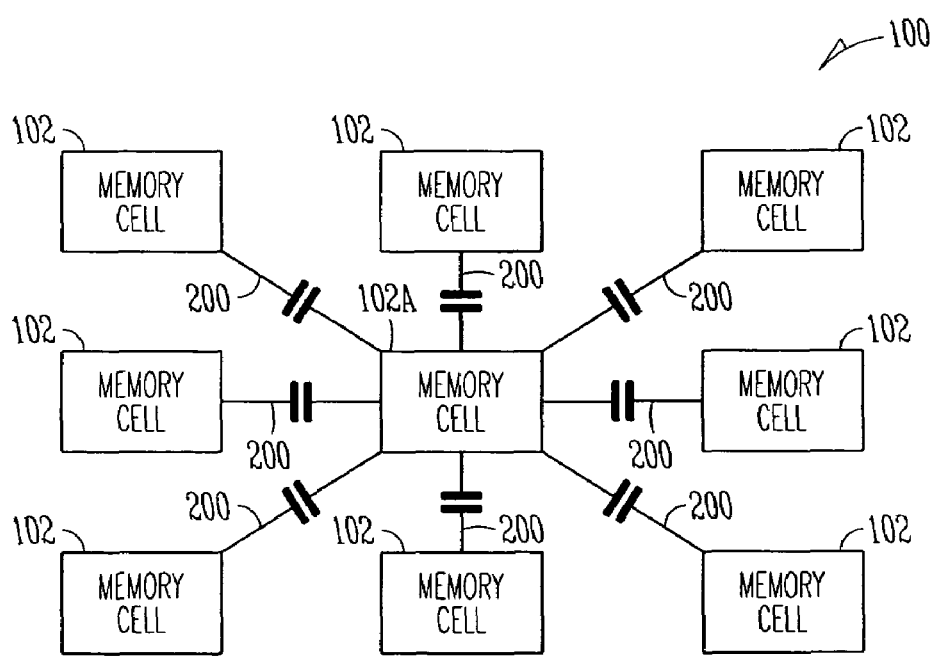
FIG. 2 illustrates another block diagram of a memory array according to various embodiments.

FIG. 2 illustrates another block diagram of the memory array 100 according to various embodiments. Changing the voltage on one or more of the memory cells 102 can interfere with a nearby specific memory cell 102A. This interference is due to the capacitive coupling 200 between neighboring cells, and as mentioned above, is referred to as Fg-Fg interference. The reduction in Fg-Fg interference is useful because once a threshold voltage Vt is set on a specific memory cell 102A, it is disadvantageous to have the programming of neighboring memory cells 102 affect and change the threshold voltage Vt already programmed onto that specific memory cell 102A.

Figure 3:
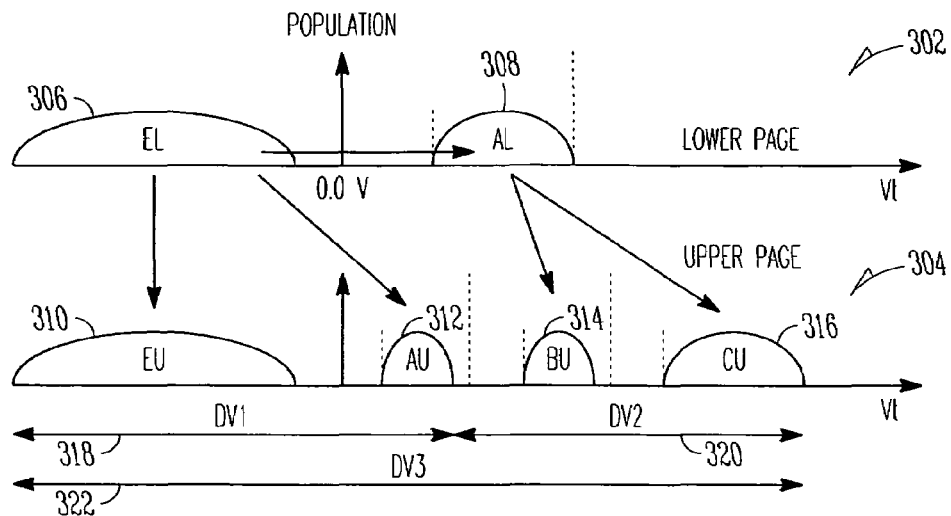
FIG. 3 is a graphical illustration of a threshold voltage distribution.

FIG. 3 is a graphical representation of a threshold voltage distribution for a multi-layer memory cell population having lower pages 302 and upper pages 304 according to various embodiments. FIG. 3 illustrates the programming of memory cells in two phases. According to this process, the lower page 302 is first programmed, followed by the upper page 304. In order to reduce Fg-Fg interference when programming the upper page 304 for a particular cell, nearby cells are either already programmed into their final state, or they are at least programmed on their lower page 302. By first programming at least the lower page 302 of neighboring memory cells, the maximum change in voltage can be reduced. The lower page 302 may begin programmed with a threshold voltage Vt within a lower page erased distribution 306. From a voltage within the lower page erased distribution 306, memory cells may be programmed to a higher threshold voltage within a first lower page distribution 308. The upper page 304 may be programmed from the lower page erased distribution 306 to a threshold voltage within an upper page erased distribution 310 or a first upper page distribution 312. The upper page 304 may also be programmed from the first lower page distribution 308 to a threshold voltage within a second upper page distribution 314 or a third upper page distribution 316. Consequently the maximum change in voltage in programming the upper page 304 from the lower page 302 is dv1 318 or dv2 320, but cannot be dv3 322.

Figure 4:
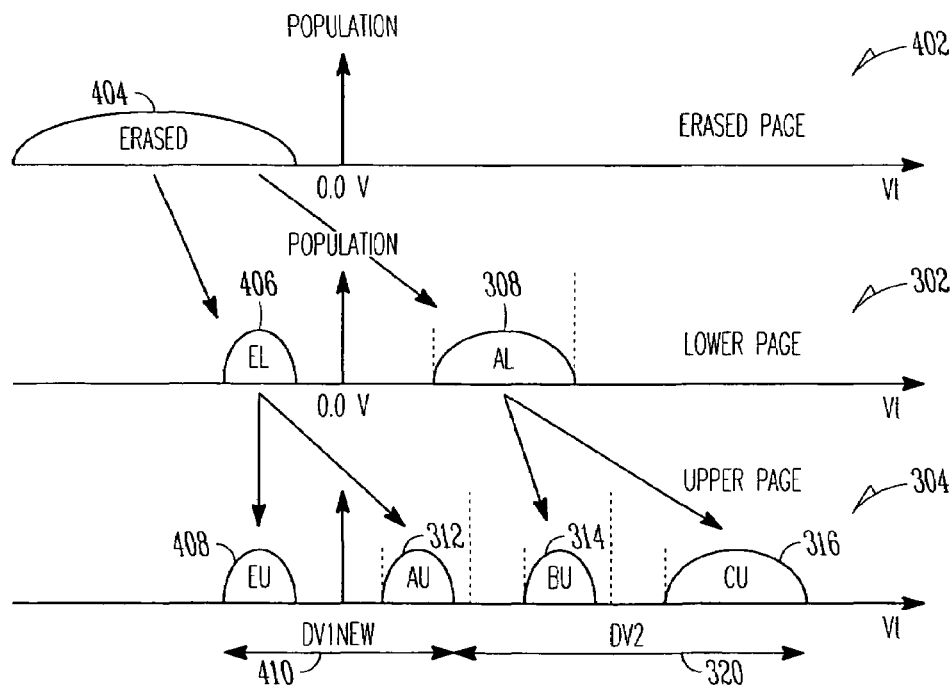
FIG. 4 is a graphical illustration of a threshold voltage distribution according to various embodiments

FIG. 4 is a graphical representation of a threshold voltage distribution for a multi-layer memory cell population having an erased page 402, a lower page 302 and an upper page 304 according to various embodiments. After a population of memory cells have been erased, they carry a threshold voltage on an erased page 402 within an erased distribution 404. This means that all of the bits for the memory cells are in erased status, and the cells are ready for lower page 302 programming. Some subset of memory cells may be programmed on their lower page by applying one or more voltage pulses to induce a threshold voltage within a desired range on the lower page of that memory cell. At substantially the same time that the lower page 302 is programmed for some subset of cells, the erased distribution 404 may be compacted to result in a compacted lower page erased distribution 406 for another subset. The compacted erased distribution 406 is created by applying a small voltage pulse to the erased distribution 404 on the erased memory cells to reduce the range of the erased distribution and create a compacted erase distribution 406 on the lower page 302. These voltage pulses decrease the distribution of threshold voltage necessary to signify an erased bit on the lower page 302.

Verify operations are used during programming (including compacting) to control the voltage applied to the memory cells for inducing a voltage in the cell. A first verify may be performed to determine when a threshold voltage is within the compacted erased distribution 406. Another verify may be performed to determine when other programmed memory cells are within a first lower page distribution 308.

When a program operation after an erase is to take place, the entire process may be done more quickly and efficiently if the programming is done using a multi-level approach or algorithm. Taking a multi-level approach allows for the compaction of the erased distribution 404 at the same time that the lower page is being programmed. The first phase may create two distributions on the lower page of a group or array of memory cells, namely the compacted lower page erased distribution 406 and the first lower page distribution 308. By creating the compacted lower page erased distribution 406 at the same time as programming the first lower page distribution 308, time is saved over performing these tasks separately.

Once nearby memory cells are at least programmed on the lower page 302, upper page 304 programming may begin for a particular memory cell. The upper page may be programmed by shifting the voltage on the lower page to the upper page. The magnitude of the voltage on the upper page may then be adjusted by applying one or more voltage pulses to induce an increased voltage within a desired range. If a particular memory cell has a threshold voltage on its lower page 302 within the compacted erased distribution 406, the upper page 304 for that cell may retain an erased value, and thus not change its threshold voltage, or may receive voltage pulses sufficient to increase its threshold voltage to within a first upper page distribution. A verify may be performed to determine when a memory cell carries its desired voltage. If a particular memory cell has a threshold voltage on its lower page within the first lower page distribution 308, it may receive voltage pulses sufficient to increase its voltage to within the second upper page distribution 314 or the third upper page distribution 316.

As mentioned above, by compacting the erased distribution 404 at the time of programming the lower page, the process is performed faster than if the erased distribution 404 is compacted separate from programming the lower page. Additionally, when all the cells that are to be programmed with a compacted lower page erased distribution 406 are programmed and verified, there is no need to perform that verify operation during the remaining lower page programming. Overall efficiency may be increased and time saved. In addition, the compacted lower page erased distribution 406 and the compacted upper page erased distribution 408 provide for a smaller range for the threshold voltage Vt. Because of the smaller range of Vt for these distributions, the change in the voltage, dv1 new 410 when programming the upper page 304 is reduced. This reduction is apparent as compared with the change in voltage, dv1 318, as shown in FIG. 3. Because the compacted lower page erased distribution 406 of FIG. 4 covers a smaller range than the lower page erased distribution 306 of FIG. 3, the change in voltage necessary to program the upper page (dv1 318 versus dv1 new 410) is accordingly less. The smaller change in voltage, dv1 new 410, allows for decreased Fg-Fg interference between memory cells.

FIG. 4 illustrates an example according to various embodiments involving two bit memory cells. This is useful for simple illustration of an example embodiment, but is not meant to limit the disclosure or the claims to a two bit application. Embodiments may be implemented using various types and sizes of multi-layer memory cells using an equivalent process to that described and claimed.

Figure 5:
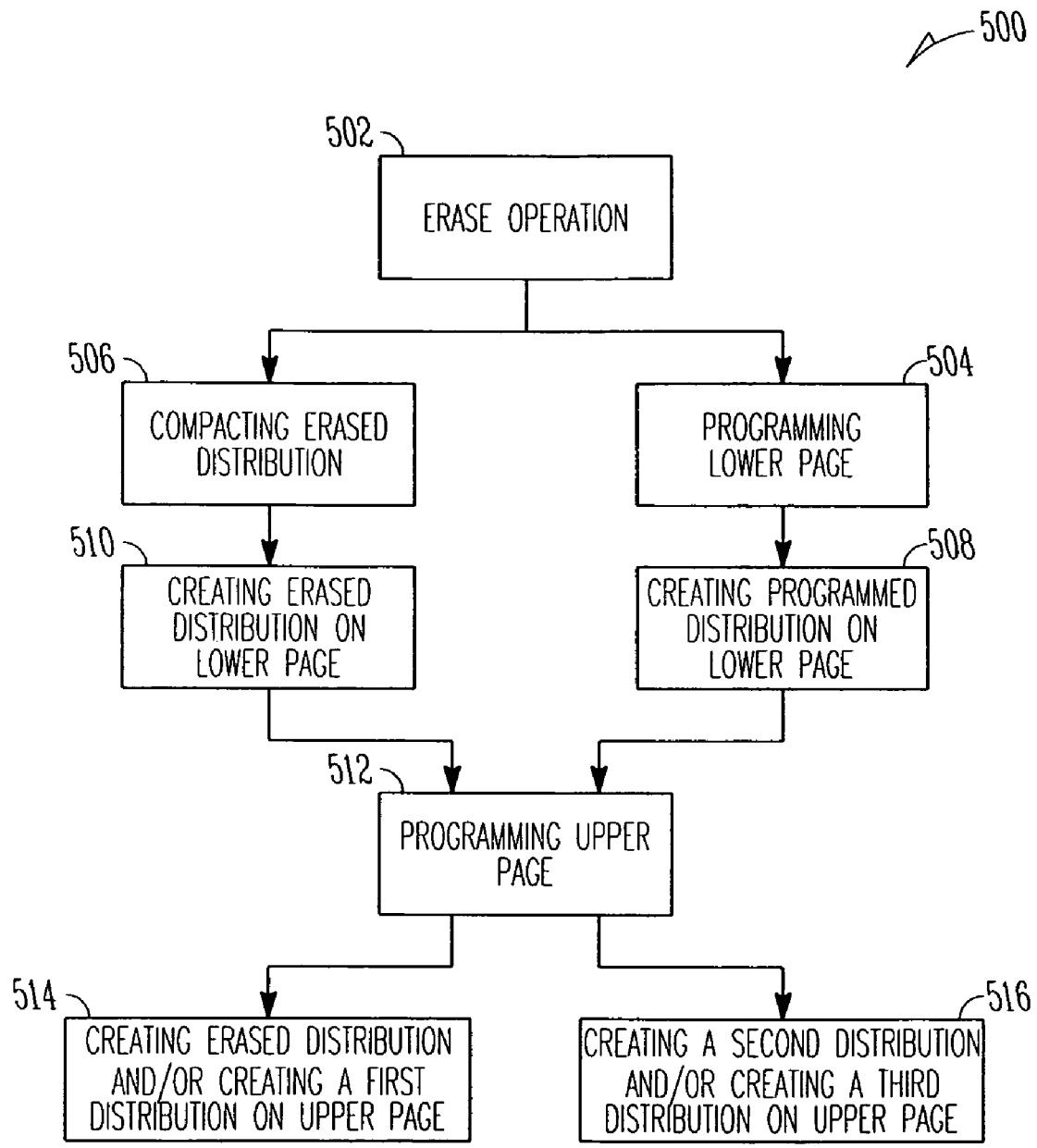
FIG. 5 illustrates a flow diagram of a memory programming process according to various embodiments.

FIG. 5 illustrates a flow diagram of a process 500 for programming memory cells to reduce Fg-Fg interference according to various embodiments. The process 500 begins with a group of memory cells having completed an erase operation and having an erased page (block 502). The lower page may be programmed for some cells(block 504) and the erased distribution may be compacted on the lower page for others(block 506) at substantially the same time. Through programming the lower page (block 504) and compacting the erased distribution (block 506), a first lower page distribution or an erased distribution on the lower page of each memory cell may be created (blocks 508 and 510). Once the lower page is programmed, the first phase of the two phase programming process is complete. The second phase involves programming the upper page (block 512). The upper page is programmed to create an upper page erased distribution or a first upper page distribution (block 514) from the compacted erased distribution on the lower page, or to create a second or third upper page distribution (block 516) from the first lower page distribution.

Because the lower page is programmed at substantially the same time that the erased distribution is compacted on the lower page (blocks 504 and 506), time is saved when compared with performing these steps separately. Additionally, because an upper page erased distribution or a first distribution on the upper page are programmed (blocks 512 and 514) after the compacting the erased distribution to create a compacted erased distribution on the lower page (blocks 506 and 510), the threshold voltage necessary to program the upper page (block 512) is reduced. This in turn reduces Fg-Fg interference because there is less voltage change to affect the capacitive coupling between neighboring memory cells.

Figure 6:
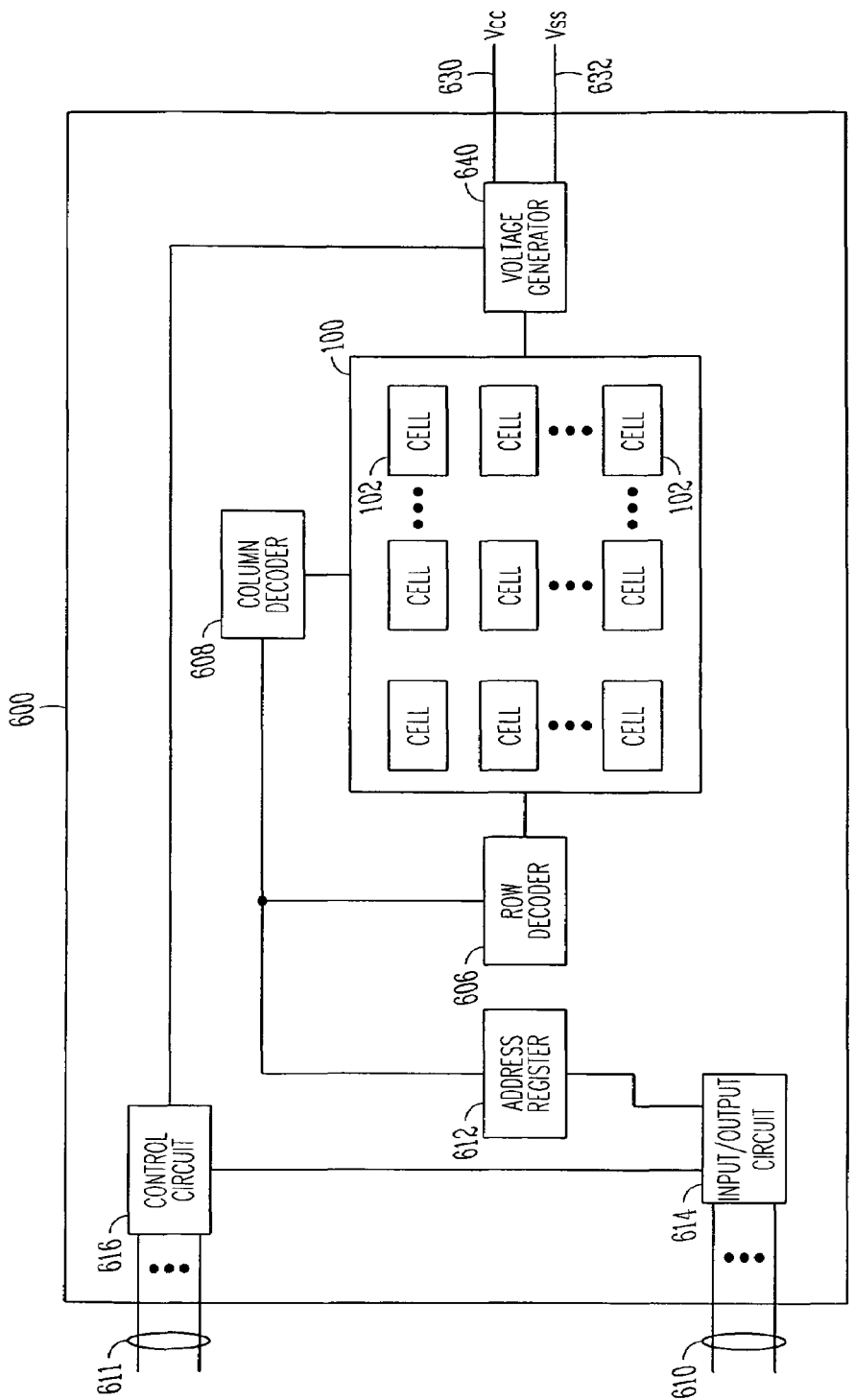
FIG. 6 illustrates a block diagram of a memory device according to various embodiments.

According to an example embodiment, FIG. 6 shows a block diagram of a memory device 600. Memory device 600 may include a memory array 100 with memory cells 102 arranged in rows and columns. Row decoder 606 and column decoder 608 may respond to an address register 612 and access memory cells 102 based on row address and column address signals on lines 610. Row decoder 606 and column decoder 608 may be used in conjunction with the address register 612 to read memory cells 102 to perform verify operations by checking the threshold voltage Vt present on memory cells 102. A data input/output circuit 614 may transfer data between memory cells 102 and lines 610. A control circuit 616 may control operations of memory device 600 based on signals on lines 610 and 611. The control circuit 616 may control other devices including the voltage generator 640 to perform operations on the memory cells 102. These operations may include programming or erasing operations. The control circuit 616 may control the voltage generator 640 to program the memory cells 102 as necessary. The programming operations may include programming on various pages of the memory cells to within various thresholds. The control circuit 616 may work in conjunction with the address register 612 and the column decoder 608 and the row decoder 606 to determine when one of the memory cells 102 has been programmed to a desired threshold voltage.

Memory device 600 may be a flash memory device. In some embodiments, memory device 600 may include a NAND flash memory device where memory cells 102 may include flash memory cells arrange in a NAND flash memory arrangement. One skilled in the art will readily recognize that memory device 600 may include other parts, which are omitted from FIG. 6 to focus on the various embodiments described herein.

Memory device 600 may include nodes 630 and 632 to receive voltages Vcc and Vss. Vcc may be the supply voltage for memory device 600, Vss may be ground. Memory device 600 may also include a voltage generator 640. Voltage generator 640 and control circuit 616 may act separately or together to provide different voltages to memory array 100 or to cause memory array 100 to have different voltages during various operations of memory device 600. The operations may include a programming operation to transfer or write data from lines 610 to memory cells 102, a read operation to transfer or read data from memory cells 102 to lines 610, and an erase operation to erase or clear data from all or a portion of memory cells 102.

Memory array 100 and memory device 600 may be used in a number of applications according to different embodiments. The applications may include digital audio players, digital cameras, digital recorders, cellular phones, and other devices using flash memory. In these and other various applications, a memory device 600 may be used in communication with other devices including but not limited to antennas, microprocessors, displays, optical circuits, graphics processors, audio processing circuits, speakers and other electronic or mechanical devices.

In the foregoing Detailed Description, various features are grouped together in a single embodiment for the purpose of streamlining the disclosure. This method of disclosure is not to be interpreted as reflecting an intention that the claimed embodiments of the inventive subject matter require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this inventive subject matter may be made without departing from the principles and scope of the inventive subject matter as expressed in the subjoined claims.

What is claimed is:

1. A method comprising:
    applying one or more first voltage pulses to one or more first memory cells having a lower page and an upper page, the one or more first voltage pulses inducing a first threshold voltage on the lower page of each of the first memory cells within a first voltage range;
    applying one or more second voltage pulses to one or more second memory cells having a lower page and an upper page, the one or more second voltage pulses inducing a second threshold voltage on the lower page of each of the second memory cell within a second voltage range;
    shifting the first and second threshold voltages on the lower page of each memory cell to the upper page of each memory cell, and adjusting the magnitude to within a final range selected from a plurality of upper page voltage ranges;
    storing for each memory cell a final voltage within a final range representing a binary value; and
    performing an erase operation on the plurality of memory cells to set the voltages on the memory cells within an erased range on an erased page of the memory cells, wherein the first range is smaller than the erased range.

2. The method of claim 1 wherein applying one or more first voltage pulses to induce a first threshold voltage on the lower page of each first memory cell includes reading the induced first threshold voltage on each first memory cell to verify that the induced first threshold voltage on each first memory cell is within the first voltage range.

3. The method of claim 1 wherein applying one or more second voltage pulses to induce a second threshold voltage on the lower page of each second memory cell includes reading the induced second threshold voltage on each second memory cell to verify that the induced second threshold voltage on each second memory cell is within the second voltage range.

4. The method of claim 1, wherein shifting the first or second threshold voltage on the lower page of a memory cell to the upper page of the memory cell is not done until neighboring memory cells at least have an induced threshold voltage on the lower page.

5. The method of claim 1, wherein a first threshold voltage on the lower page of a first memory cells within a first range represents a first least significant bit in the binary value.

6. The method of claim 1, wherein a second threshold voltage on the lower page of a second memory cell within a second range represents a second least significant bit in the binary value.

7. The method of claim 1, wherein the magnitude of a voltage within a final range on the upper page of a memory cell selected from a plurality of upper page voltage ranges represents a most significant bit in the binary value.

8. An apparatus comprising:
    a plurality of memory cells to store voltages representing a binary value having at least a most significant bit and a least significant bit, each of the memory cells having an erase page with an erase range, a lower page and an upper page;
    a first subset of the plurality of memory cells to store a voltage representing a first least significant bit;
    a second subset of the plurality of memory cells to store a first voltage representing a second least significant bit;
    a voltage generator to generate a drive voltage to be applied to the memory cells; and
    a control circuit to control the voltage generator to apply a drive voltage to induce a first threshold voltage on the lower page of each memory cell in the first subset within a first range signifying the first least significant bit and to induce a second threshold voltage on the lower page of each memory cell in the second subset within a second range signifying the second least significant bit, wherein the first range is smaller than the erase range.

9. The apparatus of claim 8, wherein the control circuit is operable to perform an erase operation on the plurality of memory cells by controlling the voltage generator to set the voltages on the memory cells within the erased range on the erased page of the memory cells.

10. The apparatus of claim 8 further comprising a column decoder and a row decoder to read the voltages on the plurality memory cells.

11. The apparatus of claim 10, further comprising an address register to control the column decoder and the row decoder.

12. The apparatus of claim 10, wherein the address register instructs the column decoder and the row decoder to read the voltages on each memory cell to verify that the induced voltage on each memory cell is within the first or second range.

13. The apparatus of claim 8, wherein the control circuit further controls the voltage generator to shift the induced voltage on the lower page of each memory cell to the upper page of each memory cell within a final range selected from a plurality of upper page voltage ranges corresponding to the most significant bit to be programmed on each memory cell.

14. The apparatus of claim 13, wherein the control circuit does not control the voltage generator to shift the voltage on the lower page of a memory cell to the upper page of the memory cell until neighboring memory cells at least have an induced voltage on the lower page.

15. A system comprising:
a plurality of memory cells capable of storing voltages representing a binary value having at least a most significant bit and a least significant bit, each of the memory cells having an erase page with an erase range, a lower page and an upper page;
a first subset of the plurality of memory cells to receive a first least significant bit;
a second subset of the plurality of memory cells to receive a second least significant bit;
a voltage generator to generate a voltage to be applied to the memory cells;
a control circuit to control the voltage generator to induce a voltage on the lower page of each memory cell in the first subset within a first range corresponding to a first least significant bit and to induce a voltage on the lower page of each memory cell in the second subset within a second range corresponding to a second least significant bit, wherein the first range is smaller than the erase range; and
a graphics processor in communication with the control circuit.

16. The system of claim 15, wherein the control circuit is operable to perform an erase operation on the plurality of memory cells by controlling the voltage generator to set the voltages on the memory cells within the erased range on the erased page of the memory cells.

17. The system of claim 15 further comprising a column decoder and a row decoder to read the voltages on the plurality memory cells.

18. The system of claim 17, further comprising an address register to control the column decoder and the row decoder.

19. The system of claim 17, wherein the address register instructs the column decoder and the row decoder to read the voltages on each memory cell to verify that the induced voltage on each memory cell is within the first or second range.

20. The system of claim 15, wherein the control circuit further controls the voltage generator to shift the induced voltage on the lower page of each memory cell to the upper page of each memory cell within a final range selected from a plurality of upper page voltage ranges corresponding to the most significant bit to be programmed on each memory cell.

21. The system of claim 20, wherein the control circuit does not control the voltage generator to shift the voltage on the lower page of a memory cell to the upper page of the memory cell until neighboring memory cells at least have an induced voltage on the lower page.

* * * * *